United States Patent
Huang et al.

(10) Patent No.: US 10,630,080 B1
(45) Date of Patent: Apr. 21, 2020

(54) SUPER-FAST TRANSIENT RESPONSE (STR) AC/DC CONVERTER FOR HIGH POWER DENSITY CHARGING APPLICATION

(71) Applicant: Alpha and Omega Semiconductor (Cayman) Ltd., Grand Cayman (KY)

(72) Inventors: Pei-Lun Huang, Zhubei (TW);
Yu-Ming Chen, Hsinchu (TW);
Tien-Chi Lin, New Taipei (TW);
Jung-Pei Cheng, Zhubei (TW);
Yueh-Ping Yu, Zhubei (TW);
Zhi-Qiang Niu, Santa Clara, CA (US);
Xiaotian Zhang, San Jose, CA (US);
Long-Ching Wang, Cupertino, CA (US)

(73) Assignee: ALPHA AND OMEGA SEMICONDUCTOR (CAYMAN) LTD., Grand Cayman (KY)

( * ) Notice: Subject to any disclaimer, the term of this patent is extended or adjusted under 35 U.S.C. 154(b) by 0 days.

(21) Appl. No.: 16/457,817

(22) Filed: Jun. 28, 2019

(51) Int. Cl.

| | | |
|---|---|---|
| *H02J 7/00* | (2006.01) | |
| *H02M 1/08* | (2006.01) | |
| *H02M 1/44* | (2007.01) | |
| *H01L 23/552* | (2006.01) | |
| *H01L 23/495* | (2006.01) | |
| *H01L 23/00* | (2006.01) | |
| *H01L 23/31* | (2006.01) | |
| *H01L 25/065* | (2006.01) | |

(Continued)

(52) U.S. Cl.
CPC ............ *H02J 7/00* (2013.01); *H01L 23/3107* (2013.01); *H01L 23/49503* (2013.01); *H01L 23/49575* (2013.01); *H01L 23/552* (2013.01); *H01L 24/48* (2013.01); *H01L 25/0655* (2013.01); *H02M 1/08* (2013.01); *H02M 1/44* (2013.01); *H02M 3/33523* (2013.01); *H05K 1/111* (2013.01); *H05K 1/181* (2013.01); *H01L 2224/48247* (2013.01); *H02J 2007/0062* (2013.01); *H02J 2207/20* (2020.01); *H02M 3/335* (2013.01); *H02M 2001/0083* (2013.01); *H05K 2201/1003* (2013.01); *H05K 2201/10166* (2013.01); *H05K 2201/10545* (2013.01); *H05K 2201/10636* (2013.01)

(58) Field of Classification Search
CPC ...................... H02M 3/335; H02M 2001/0083
USPC .................................. 363/21.14, 21.15, 147
See application file for complete search history.

(56) References Cited

U.S. PATENT DOCUMENTS

2002/0071293 A1* 6/2002 Eden .................... H01L 23/4824
363/20
2013/0242618 A1* 9/2013 Yamada ............ H01L 29/66431
363/17

(Continued)

*Primary Examiner* — Gary A Nash
(74) *Attorney, Agent, or Firm* — Chen-Chi Lin

(57) ABSTRACT

A charger comprises a housing, a first multi-layer printed circuit board (PCB), a second multi-layer PCB, and a third multi-layer PCB. The first PCB comprises at least a portion of a primary side circuit. The second PCB comprises at least a portion of a secondary side circuit. The third PCB is perpendicular to the first PCB and the second PCB. An isolation coupling element is disposed on the third PCB. The isolation coupling element comprises a multi-layer PCB. The first PCB comprises a high voltage (HV) semiconductor package. A surface of a die paddle of the HV semiconductor package is exposed from a molding encapsulation of the HV semiconductor package.

20 Claims, 18 Drawing Sheets

(51) Int. Cl.
*H05K 1/11* (2006.01)
*H05K 1/18* (2006.01)
*H02M 3/335* (2006.01)
*H02M 1/00* (2006.01)

(56) References Cited

U.S. PATENT DOCUMENTS

2014/0197889 A1* 7/2014 Makiyama ............ H01L 23/291
　　　　　　　　　　　　　　　　　　　　　　　330/277
2017/0279360 A1* 9/2017 Mutsuura ................ H02M 1/32

* cited by examiner

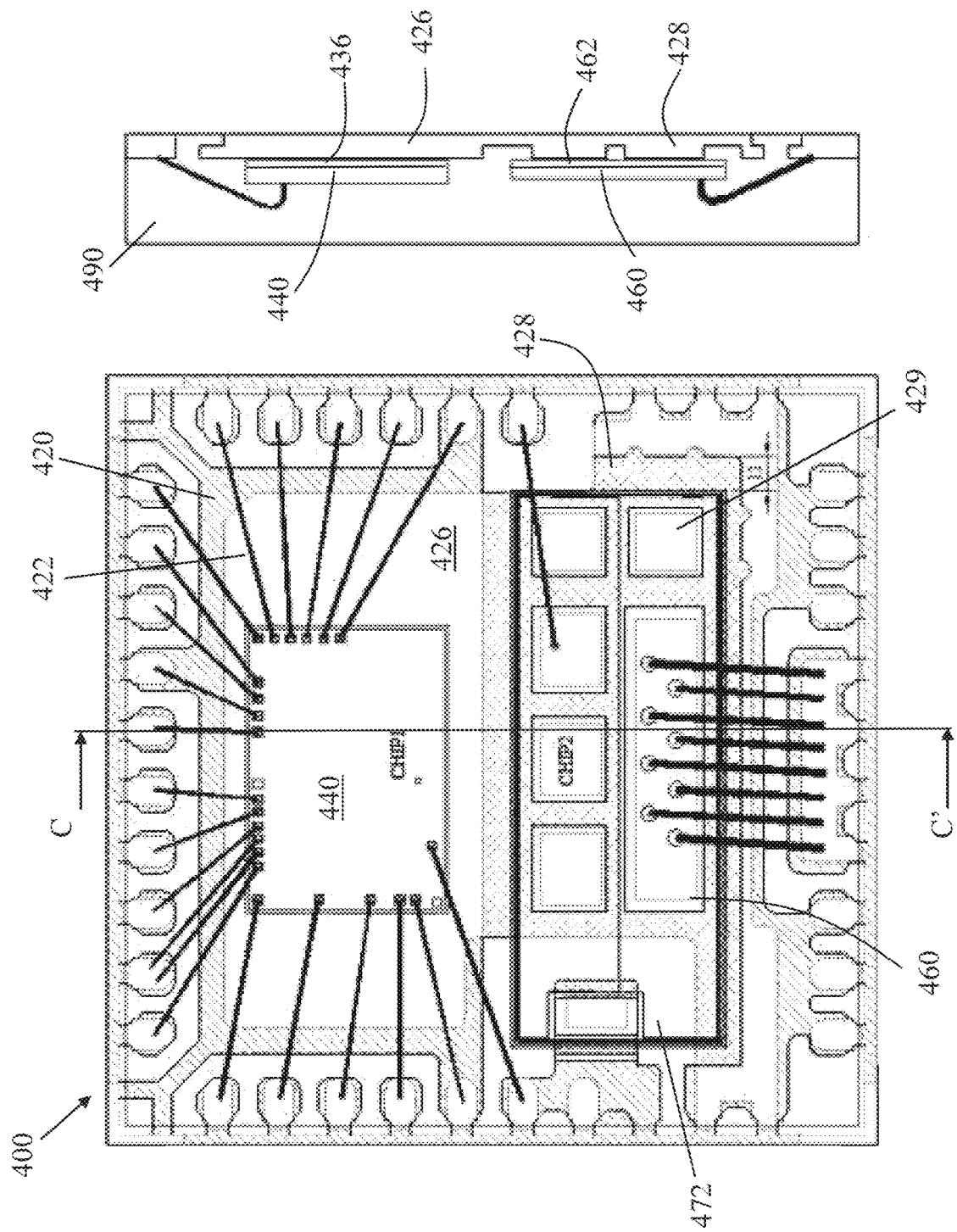

US 10,630,080 B1

SUPER-FAST TRANSIENT RESPONSE (STR) AC/DC CONVERTER FOR HIGH POWER DENSITY CHARGING APPLICATION

FIELD OF THE INVENTION

This invention relates generally to a Super-Fast Transient Response (STR) alternating current/direct current (AC/DC) Converter and corresponding application for high power density charging. The STR AC/DC converter provides the benefit of using smaller transformer and capacitors with improved performance. In combination with unique printed circuit board (PCB) designs and components integrations, a compact Power Delivery (PD) charger is assembled to provide more than 0.6 W/CC power density for fast charging application.

BACKGROUND OF THE INVENTION

FIG. 1A is a simplified circuit diagram of a traditional charger based on a pulse width modulation (PWM) control fly-back AC/DC converter. A transformer TX1 transfers energy received from a primary side source to a secondary side to power a load. The transformer TX1 has a first end of its primary coil connected to an input voltage $V_{Bulk}$, presumably a rectification output from an AC wall outlet. A second end of the transformer primary coil is connected to a main switch Q1 to regulate a current through the primary coil of the transformer for energy to be transferred to the secondary side of the transformer. A main controller is located on the primary side of the transformer to control the on and off of the main switch. A feedback loop with an error amplifier located at the secondary side of the transformer provides the output information back to the controller on the primary side through an opto-coupler. As shown in FIG. 1B, an operation frequency of circuit in FIG. 1A is limited to 65 kHz to 85 kHz at peak load. The PWM controller has a control bandwidth (BW) limited by current mode control loop bandwidth (BW~0.1×fs) around one tenth of the switching frequency. As a result of the low operation frequency and narrow control bandwidth, the output voltage transient response is slow. FIG. 1C shows the large fluctuations of output voltage, $V_{out}$, transient response when a load transits between no load and 100% load, due to slow transition of operation frequency $f_s$. Furthermore, for a conventional PWM controller, in order to maintain high conversion efficiency corresponding to the load condition change, it is necessary to switch the operation of a PWM controller between different operation modes of Continue Conduction Mode (CCM) and Discontinue Conduction Mode (DCM). Constant current compensation loop and constant voltage compensation loop are usually required to maintain stable operation of the controller. Therefore, a traditional charger based on a PWM control fly-back AC/DC converter inevitably requires extra components.

FIG. 1D and FIG. 1E show respectively a top view and a cross sectional view of a conventional vertical MOSFET transistor commonly used in a traditional charger of FIG. 1A. The transistor has drain electrode D located on a bottom surface of a transistor die connected to a die paddle of a lead frame having a bottom surface exposed from an encapsulation. A source electrode and a gate electrode are located on a top surface of the transistor die. The source electrode and the gate electrode are connected to a source lead S and a gate lead G. FIG. 1F shows a PCB layout 10 for a traditional charger of FIG. 1A. The PCB layout 10 is configured to receive a conventional MOSFET device of FIG. 1D and FIG. 1E. The conventional MOSFET device has a small area source lead connected to a small copper pad 11 on the PCB and a large area drain lead 14 connected to a large copper pad area 12 on the PCB. The drain electrode of the MOSFET chip is connected to the transformer TX1 through the large contact area between drain lead 14 and copper pad area 12. The source electrode of the MOSFET chip is connected to ground through resistor R2. The performance of the PCB layout 10 is not optimized due to unavoidable tradeoff between thermal dissipation and electromagnetic interference (EMI) noise reduction. The MOSFET device Q1 is hot and needs a large copper pad area 12 (for example, larger than 10 mm in length and 5 mm in width) for cooling. However, the large area drain lead 14 has high voltage and has high dv/dt value. It couples EMI noise to the system. This may not be a problem for low voltage applications. However, for high voltage applications such as 500V or higher, the EMI noise is high due to the fast changing and high drain voltage. It requires a small copper pad area 12 to reduce the EMI noise. This is in contrary to the need of having larger copper pad area 12 for cooling purpose. The tradeoff of a large copper pad area 12 is large EMI noise. In order to meet regulation requirements, additional bulky heat sink and metal shielding are used to improve thermal performance and RFI shielding. Furthermore, for high voltage applications, the high voltage drain lead with large area will demand large safety space therefore increasing the device area, making it challenging to minimize the device size while keeping safety space for high voltage.

Desirable features of a charger for a portable device include high performance to provide safe charging without damaging the device to be charged, fast charge to save time and compact size to save space for the convenience of mobility. Such desirable features would force a charger to use less component counts and smaller size components such as smaller transformers and smaller capacitors with the capability to handle higher power density without much cost increase. The increase of the power density would cause thermal and EMI problems. The use of smaller components or less component counts would potentially impact the performance of a charger. Therefore, the best charger, currently available in the market, provides less than 0.5 W/CC power density. The present disclosure provides solutions beyond 0.5 W/CC by applying novel system circuit control, co-packaging a main switch and a control integrated circuit (IC) on a single die paddle, and using a four-layer printed circuit board (PCB). Therefore, EMI is reduced, thermal performance is improved, and fast turn-on is achieved.

SUMMARY OF THE INVENTION

The system circuit control of the present disclosure utilizes a secondary side constant-on-time (COT) control such that a feedback loop with comparator in a main controller is located on the secondary side (instead of using error amplifier on the primary side in prior art). The response of the control of the present disclosure is much faster compared to the traditional control. Natural peak load operation frequency is clamped at maximum 150 kHz (compared to 65K-85K Hz of traditional maximum). The higher switching frequency of 150 kHz not only provides the benefit of fast response transient regulation, it also enables the use of smaller transformer for the same output power and smaller capacitors. Furthermore, the control scheme of the present disclosure does not require any additional components for compensation loop. Therefore, the present disclosure is capable of packing a system into a smaller space without degrading thermal and electrical performance.

The size of a transformer of the present disclosure is reduced because a number of turns is decreased from 58 turns for 85 kHz maximum frequency to 45 turns for 150 kHz maximum frequency. The 13 turns margin can be used for selecting a smaller size core or for selecting a larger diameter wire for size reduction or copper loss.

The size of a capacitor of the present disclosure is reduced because of a COT full range switching frequency feedback control scheme, a maximum duty cycles up to 80%; an automatic frequency sweep with load condition up to 150 kHz; and no sub-harmonic issue by not using current mode control.

The present invention discloses an AC/DC charger comprising a housing, a first PCB, a second PCB, a third PCB, a first plug blade, and a second plug blade. The first PCB comprises a primary side circuit. The second PCB comprises a secondary side circuit. The third PCB is perpendicular to the first PCB and the second PCB. The first, second, and third PCBs of the present disclosure are multi-layer PCBs, preferably four-layer PCBs. They provide extra heat dissipation areas in addition to the contact areas.

Separated primary PCB (with a primary controller) and secondary PCB (with a secondary controller) provide the advantage to optimize the component arrangement with the assistance of a three-dimensional supporting fixture to pack the system in a minimum space. In one example, an isolation coupling element is disposed on the third PCB. The isolation coupling element comprises a multi-layer PCB coreless transformer, preferably a four-layer PCB coreless transformer. The PCB base coreless transformer provides the flexibility as a stand-alone surface mount component or as being embedded inside a mother board.

The first PCB and the second PCB each comprises a semiconductor package. A bottom surface of a die paddle of the semiconductor package is exposed from a molding encapsulation. The exposed surface of the die paddle is directly attached to a conductive area of the PCB. The semiconductor package of the present disclosure utilizes MOSFET flip-chip packaging technique to co-package a MOSFET transistor and a control IC on a single die paddle. It provides a large area source electrode exposed from the bottom surface of the encapsulation to improve thermal dissipation and to reduce EMI for both primary side and secondary side of the transformer.

BRIEF DESCRIPTION OF THE DRAWINGS

FIG. 7A is a top view and FIG. 7B is a cross sectional view of a semiconductor package in examples of the present disclosure.

DETAILED DESCRIPTION OF THE INVENTION

Figure 2A:
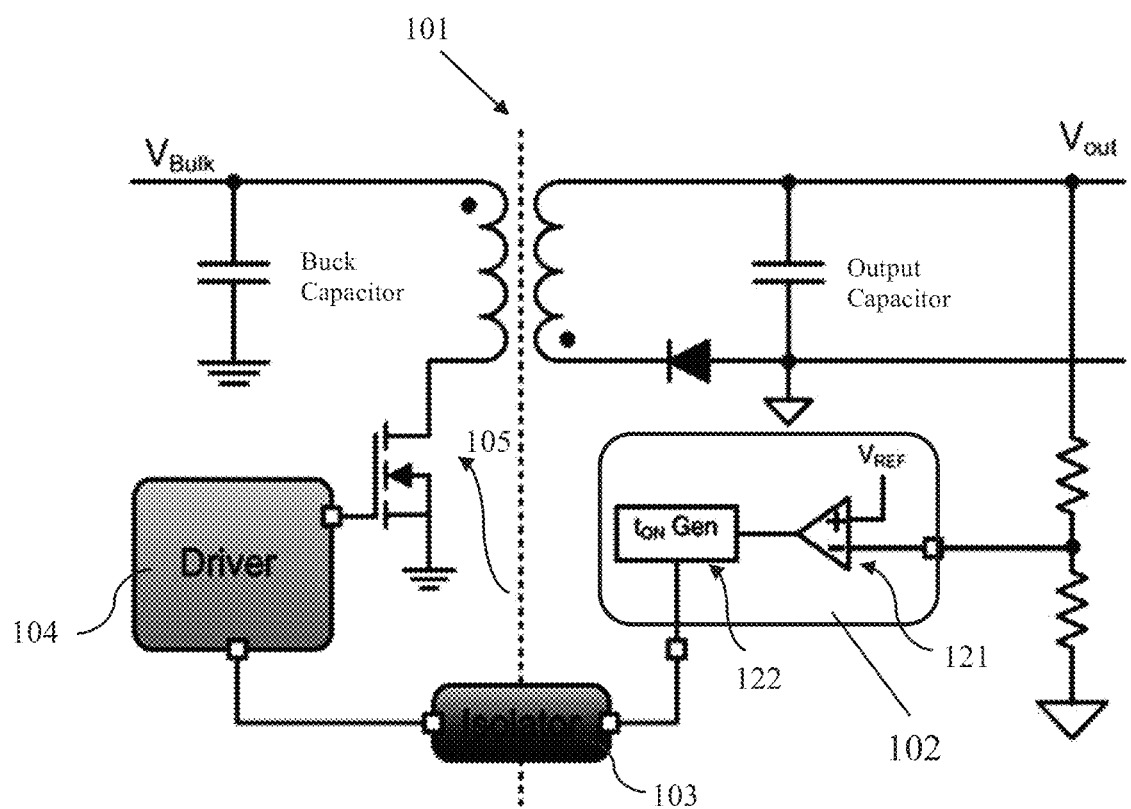
FIG. 2A is a simplified circuit diagram of a charger in examples of the present disclosure.
Figure 2C:
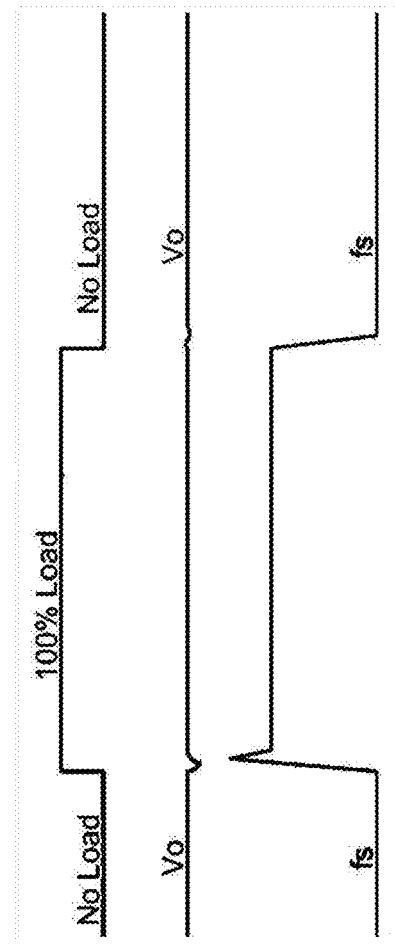
FIG. 2C is a diagram of an output transient response of a charger in examples of the present disclosure.
Figure 2D:
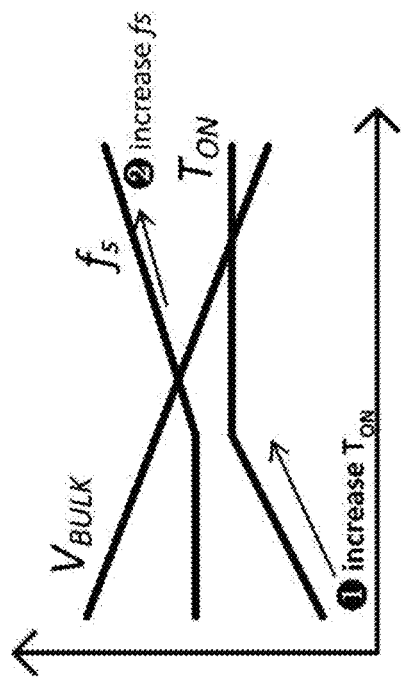
FIG. 2D shows the control response of decreasing bulk voltage of a charger in examples of the present disclosure.
Figure 2B:
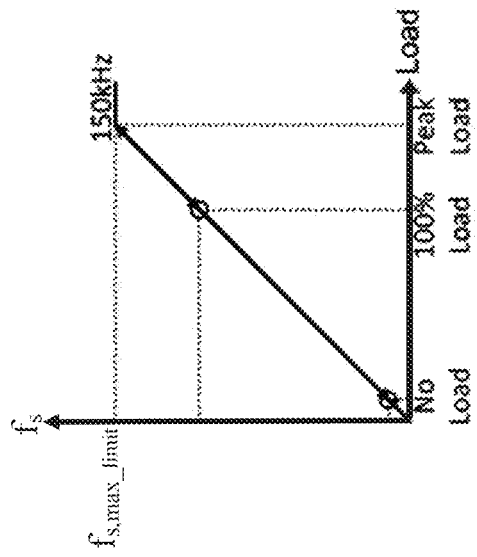
FIG. 2B is a switching frequency load dependence of a charger in examples of the present disclosure.

FIG. 2A is a simplified circuit diagram of a charger based on a secondary side constant on time control (COT) of fly-back AC/DC converter in examples of the present disclosure. The controller 102 is located on the secondary side of transformer 101. The controller 102 includes a feedback loop on the secondary side with a comparator 191 receiving a feedback voltage proportional to the output voltage on its inverse terminal comparing to a reference voltage on its non-inverse terminal. The comparison result is received by an on-time generator 192 which processes the information it receives to generate an on-time control signal transmitted through an isolation coupling element 103 to a driver 104 on the primary side of the transformer 101. The driver generates a driving signal according to the on-time control signal it received to turn on and off a main switch 105 to regulate the current flow through the primary coil of the transformer 101. The main switch 105 can be driven at an operation frequency much higher than the maximum 85 kHz of the tradition PWM control scheme. As shown in FIG. 2B, Natural peak load operation frequency is clamped at maximum 150 kHz for circuit in FIG. 2A. Super-fast transient response (STR) is achieved by using COT full range switching frequency feedback control scheme, as a result shown in FIG. 2C, the output voltage ($V_{out}$ of FIG. 2A and $V_o$ of FIG. 2C) is very stable with only small fluctuations during load transitions.

Figure 1A:
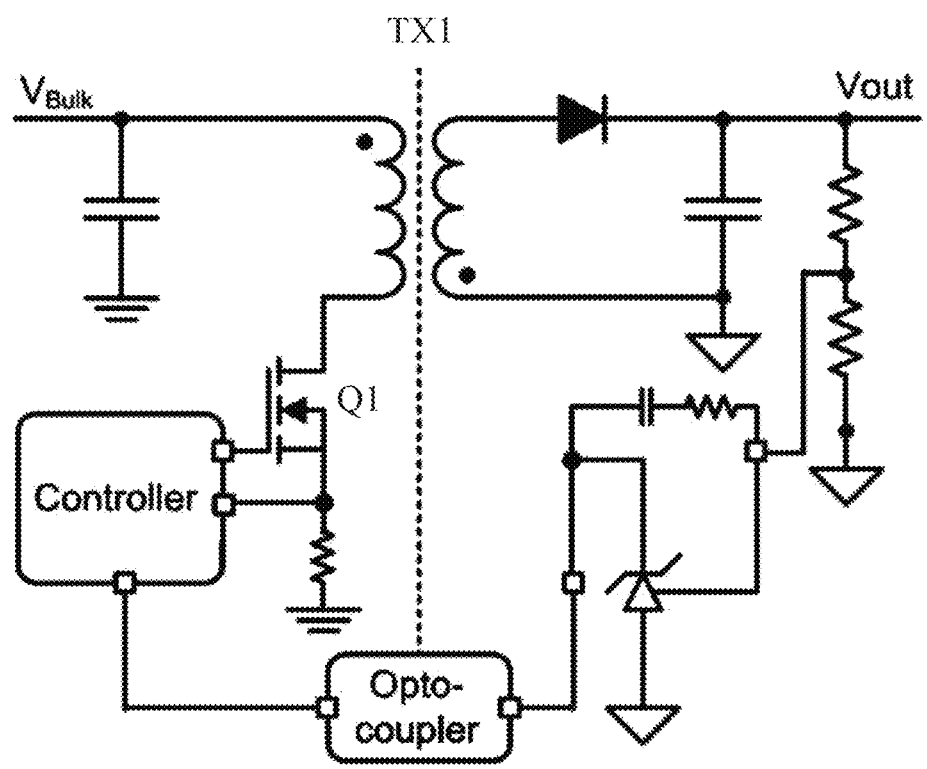
FIG. 1A is a simplified circuit diagram of a prior art charger.
Figure 1C:
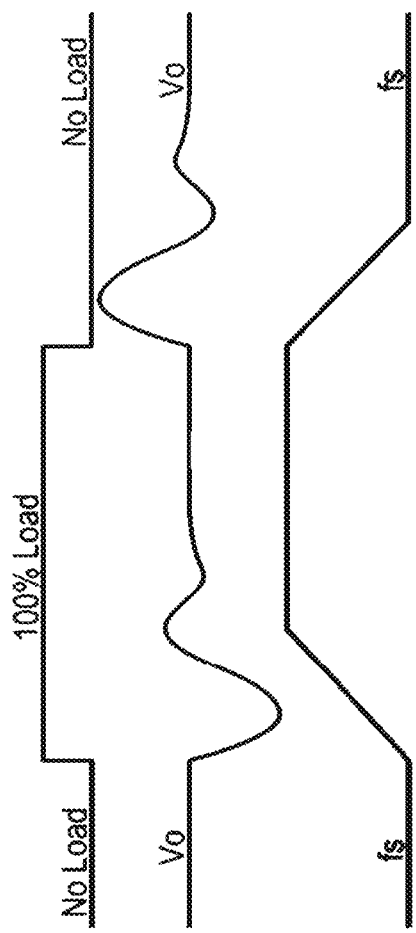
FIG. 1C is a diagram of an output transient response of a prior art charger.
Figure 1B:
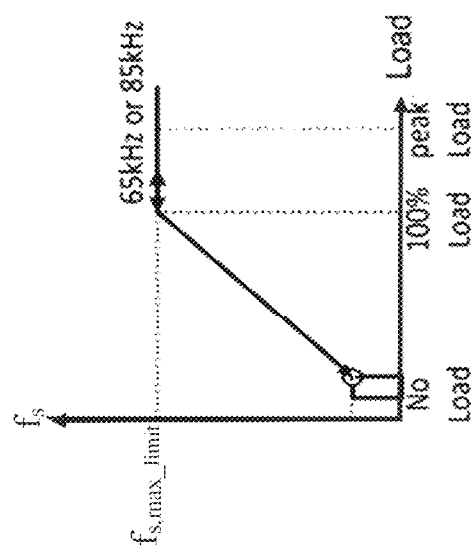
FIG. 1B is a switching frequency load dependence of prior art charger.
Figure 1D:
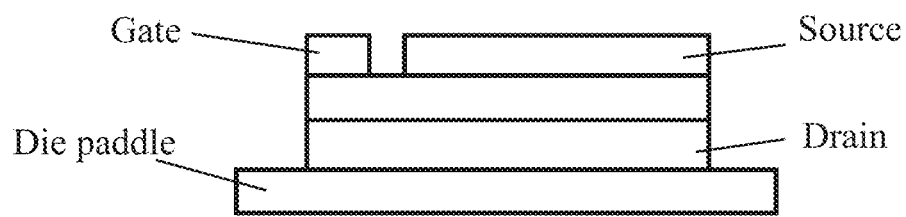
FIG. 1D and FIG. 1E show respectively a top view and a cross sectional view of a conventional vertical MOSFET transistor used in a prior art charger.
Figure 1E:
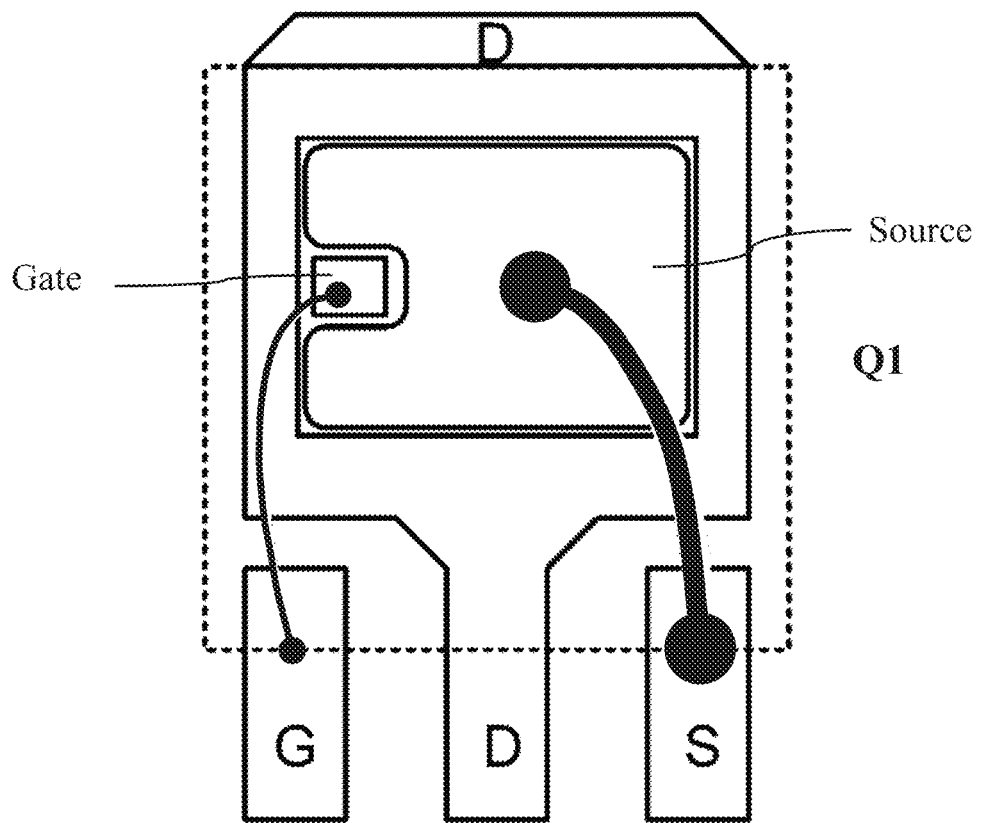
Figure 1F:
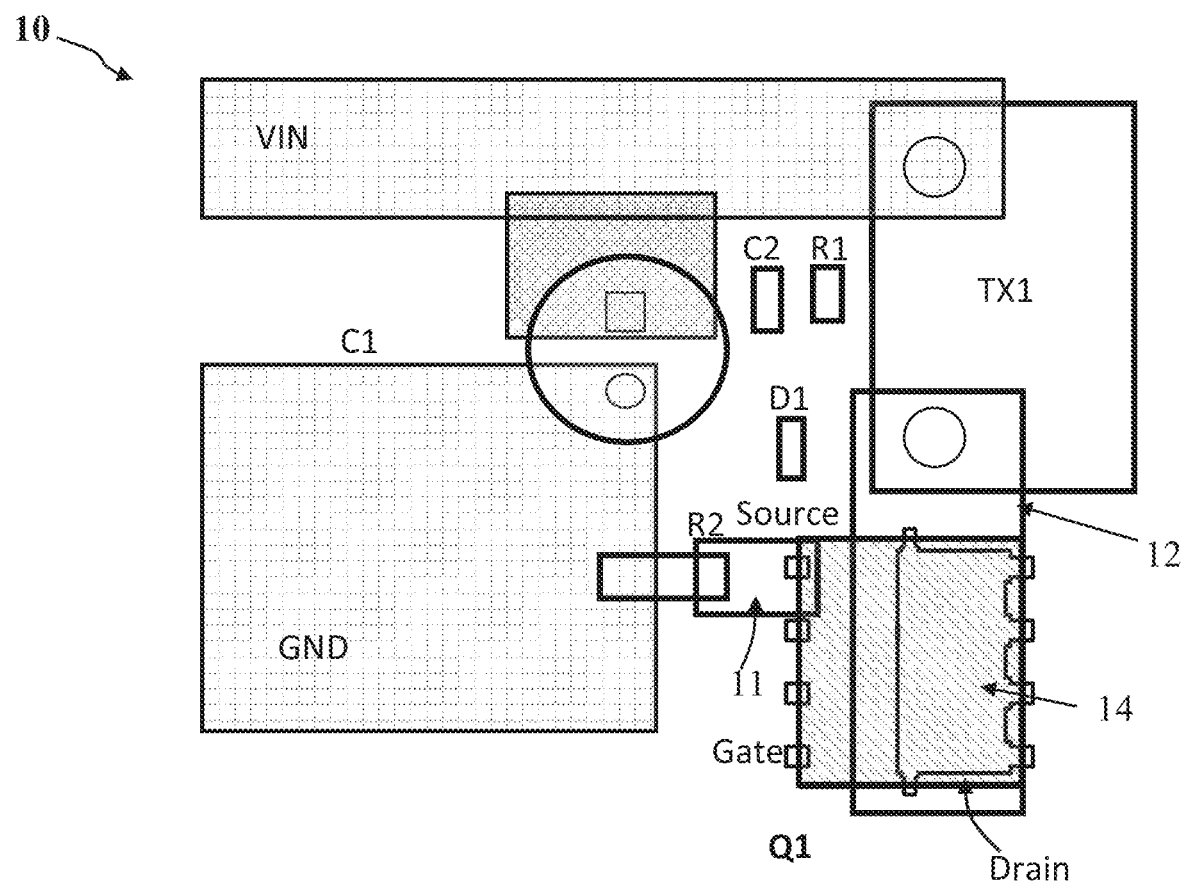
FIG. 1F shows a PCB layout for a prior art charger.

In examples of the present disclosure, the much higher operation frequency offered by the second side COT control scheme provides the advantage to reduce transformer size in fabrication of a charger based on this control scheme. For example, assuming the circuit in FIG. 2A runs at 150 kHz at 100% load with a peak current $I_{pk}$ of 1.0 Amp, in comparison, the circuit in FIG. 1A runs at 85 kHz of 100% load would have to increase its peak current $I_{pk}$ to 1.3 Amp in order to provide the same output power according to the equation 1:

$$P_o = 0.5 \times L_m \times i_{pk}^2 \times f_s \qquad \text{equation 1}$$

Where $P_o$ is the output power, $L_m$ is the transformer inductance and $f_s$ is the operation frequency. If full load turn ratio design at maximum frequency of 85 kHz is 58 turns, the full load turn ratio design at 150 kHz can be reduced to 45 turns according to the relation in equation 2 below.

$$L \times I_{peak} = N_p \times B_{sat} \times A_e \qquad \text{equation 2}$$

Where $N_p$ is the primary coil turns, $B_{sat}$ is the core saturation magnetic flux density, and $A_e$ is the core cross area. As a result, there are 13 turns margin for choosing a smaller size core or using larger diameter wires for reducing size or copper loss.

In examples of the present disclosure, the characteristic of super-fast transient response (STR) of the control scheme enables auto frequency sweep with load condition up to 150 kHz. This provides the advantage to reduce bulk capacitor (input capacitor) size in fabrication of a charger based on this control scheme. In examples of the present disclosure, as shown in FIG. 2D, in full load condition, when bulk capacitor voltage, $V_{Bulk}$, decreases, the control scheme increases on time, $T_{on}$, to keep loading till maximum $T_{on}$ is reached. In examples of the present disclosure, if the bulk capacitor voltage, $V_{Bulk}$, continues to decrease, the control scheme will increase switching frequency, $f_s$, to keep loading. The second side COT control scheme increases the maximum duty cycle up to 80%, compared to 60% offered by the conventional PMW control scheme. Enlarged maximum duty cycle provides more power at low bulk voltage, or a smaller bulk capacitor can be used without impacting the control performance. In examples of the present disclosure, the control scheme has no sub-harmonic issue since it is not based on current mode control. Lower frequency components require a larger capacitor to filter out.

Figure 2E:
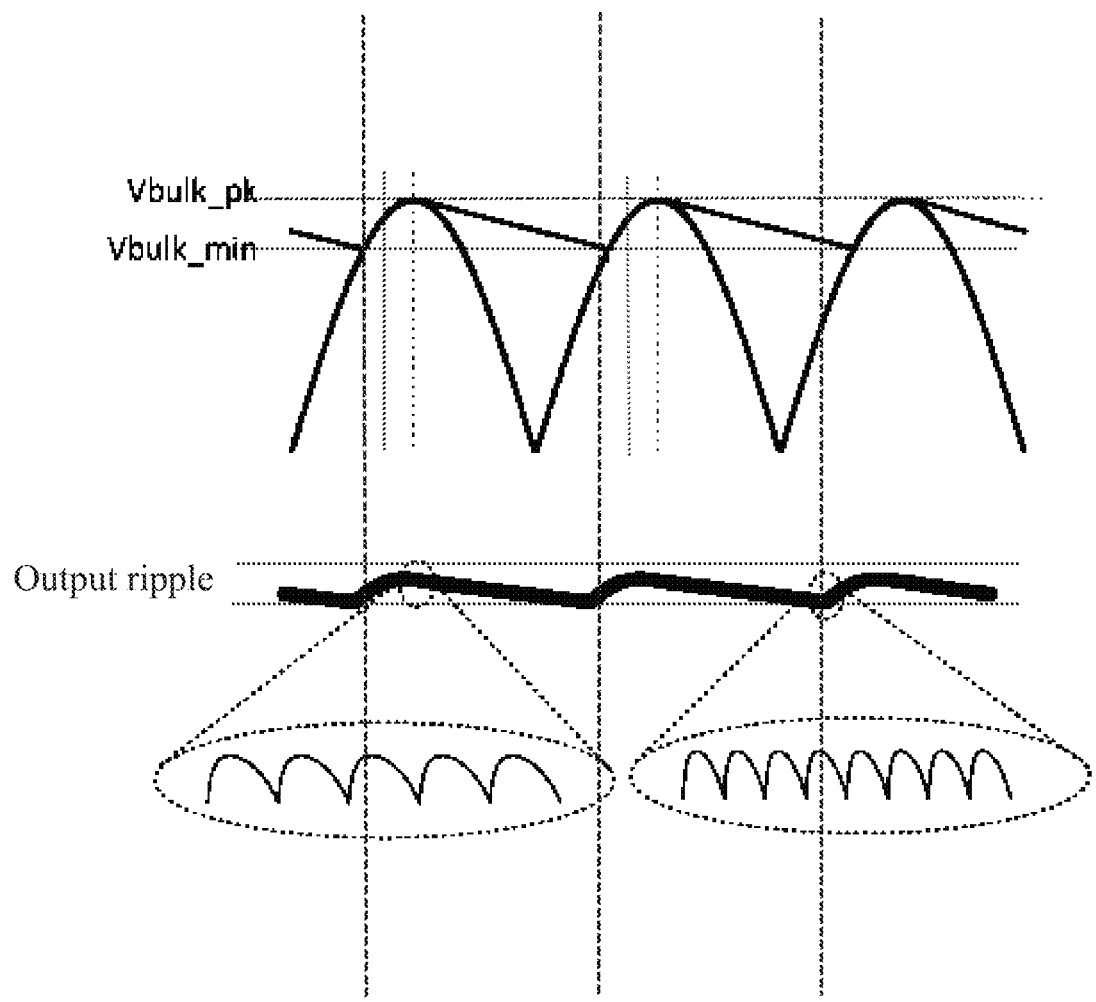
FIG. 2E shows the output ripple of a charger in examples of the present disclosure.

The output voltage $V_{out}$ has a ripple noise that includes a low frequency AC ripple inherited from the bulk voltage at twice the input AC source frequency, plus a high frequency switching ripple at the switching frequency $f_s$ due to the switching operation of the main switch. In examples of the present disclosure, as shown in FIG. 2E, the switching ripple frequencies around the peaks of the bulk voltage $V_{bulk}$ are lower than the switching ripple frequencies around the valleys of the bulk voltage $V_{bulk}$. In one example, "around the peaks" and "around the valleys" refer to less than 10% duty cycle from the peaks or valleys respectively. In another example, "around the peaks" and "around the valleys" refer to less than 20% duty cycle from the peaks or valleys respectively. This is because the control scheme provides higher switching frequency at the AC ripple valley and lower switching frequency at the AC ripple peak. This is in contrast to the conventional control scheme where the switching frequency is fixed for both bulk voltage peak and valley. The increase of switching frequency from the low frequencies AC ripple peak to valley and the decrease of switching frequency from the low frequencies AC ripple valley to peak avoid voltage swinging and reduce AC ripple and switching ripple noise. By this feature of the present disclosure, output capacitor can be smaller in size.

In examples of the present disclosure, the control scheme enables the use of smaller bulk capacitor and output capacitor. In an example with 10 W output power, the system uses a bulk capacitor of 16.8 μF and an output capacitor of 720 μF. Compared to a 10 W iPad charger based on conventional control scheme that uses a bulk capacitor of 24 μF and an output capacitor of 1200 μF, the control scheme uses a smaller bulk capacitor that is only 70% of prior art and a smaller output capacitor that is only 60% of prior art. Furthermore, the control scheme of the present disclosure does not need any components for compensation loop. All these features of the present disclosure help to reduce the size of a charger based on the novel control scheme.

Figure 3A:
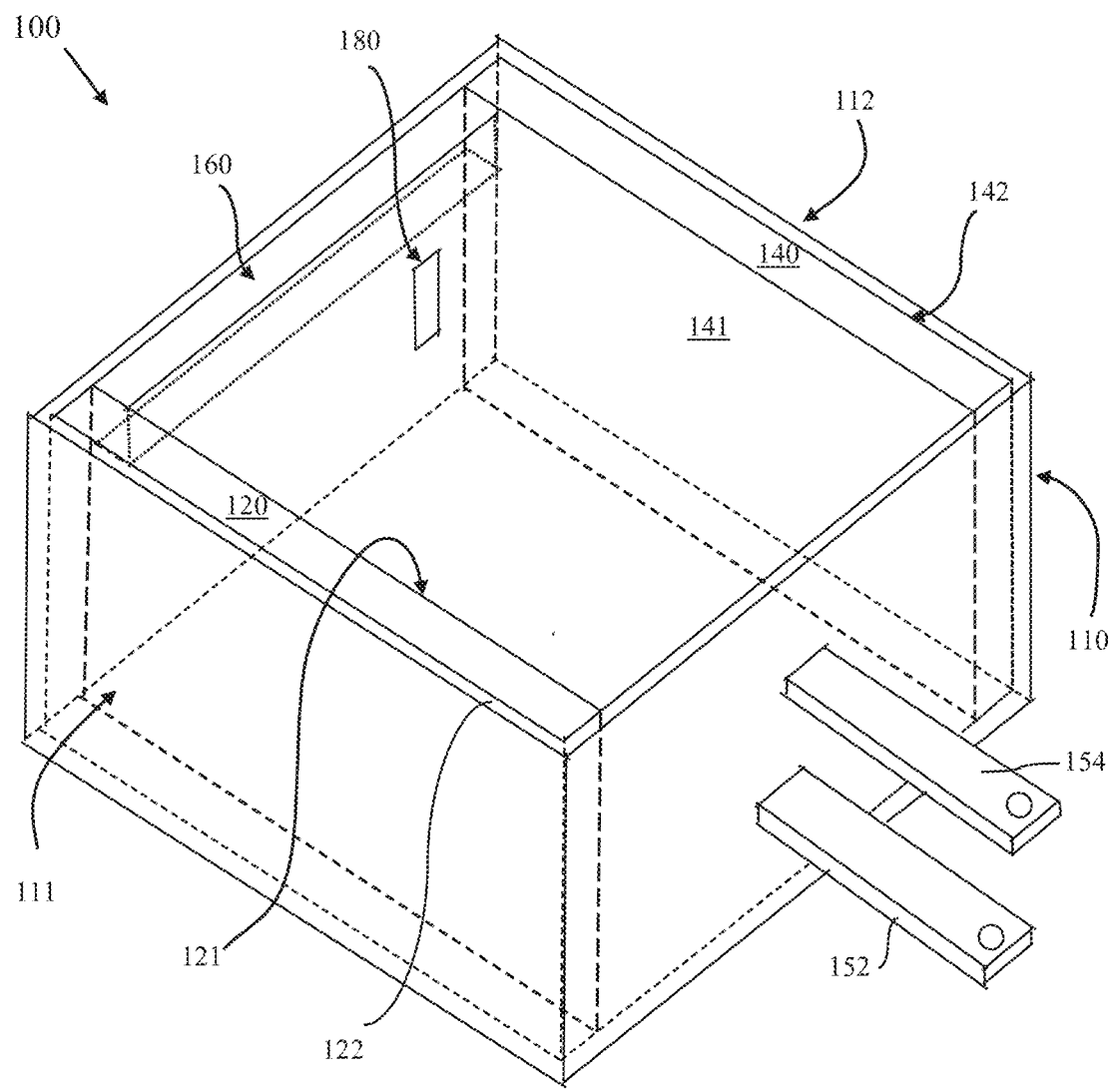
FIG. 3A is a perspective view of a charger in examples of the present disclosure.
Figure 3B:
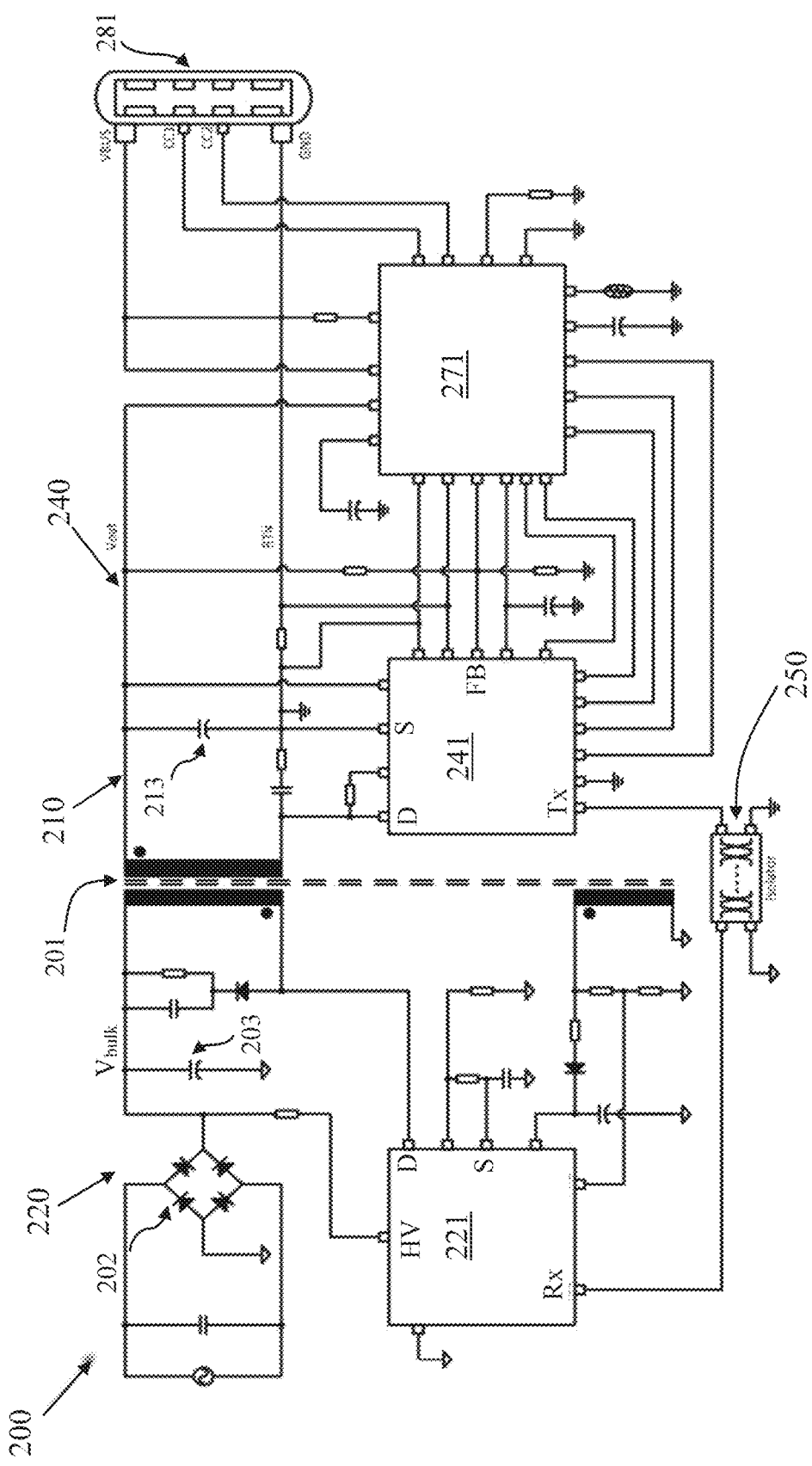
FIG. 3B is a circuit of a charger in examples of the present disclosure.

FIG. 3A is a perspective view of a charger 100 in examples of the present disclosure. FIG. 3B is an AC/DC flyback converter circuit 200 of the charger 100 in examples of the present disclosure. The charger 100 comprises a housing 110, a first printed circuit board (PCB) 120, a second PCB 140, a first plug blade 152, and a second plug blade 154. The housing 110 is of a cube shape or a rectangular prism shape. Optional rounded corners may apply to the housing 110. The first PCB is approximate to a first side surface 111 of the housing 110. The second PCB 140 is approximate to a second side surface 112 of the housing 110. The second side surface 112 is opposite to the first side surface 111. The first plug blade 152 and the second plug blade 154 extend through a bottom surface of the housing 110. The bottom surface of the housing 110 is perpendicular to the first and second side surfaces 111 and 112. In one example, the first plug blade 152 and the second plug blade 154 are disposed away from each other in a direction parallel to the first and second side surfaces 111 and 112. In another example, the first plug blade 152 and the second plug blade 154 are disposed away from each other in a direction perpendicular to the first and second side surfaces 111 and 112. An outlet connector, such as an USB Type-C connector or a minimized type standardized connector, is exposed through an opening 180 on a top surface of the housing 110, opposite to the bottom surface. In FIG. 3A, the housing 110 and the first PCB 120 are shown in transparent.

FIG. 3B is a more detailed circuit diagram that utilizes the same control scheme as FIG. 2A. As shown in FIG. 3B, the AC/DC flyback converter circuit 200 includes a transformer 201 having a first terminal of a primary coil connected to receive a bulk voltage, $V_{Bulk}$, rectified from an AC input by a bridge rectifier 202 with a filter circuit including a bulk capacitor 203. A second terminal of the primary coil is connected to a drain terminal of a primary side receiver 221. The primary side receiver 221 further includes an Rx terminal to receive a control signal generated at the secondary side as a gate control signal to regulate a primary current flow through the primary coil. The primary side receiver 221 may also include a high voltage terminal HV to receive the bulk voltage to generate a starting signal to control the primary current flow at the beginning that the AC input is provided, before the control signal generated at the secondary side is received at the Rx terminal. On the secondary side of the transformer 201, a superfast-transient response (STR) controller 241 operated in the same control scheme as the controller 102 in FIG. 2A is provided to receive the output feedback signal at a feedback terminal FB. After processing the feedback signal, the secondary side STR controller 241 generates the constant on time control signal. An isolation coupling element 250 connecting between a transmission terminal Tx of the secondary side STR controller 241 and the Rx terminal of the primary side receiver 221 transmits the constant on time control signal from the secondary side to the primary side of the flyback converter.

The secondary side of the AC/DC flyback converter circuit 200 further includes a, standard, highly integrated power delivery (PD) controller 271 to communicate with loads through a multi-pin output interconnection socket 281. The highly integrated PD controller 271 may equip with a built-in microcontroller unit (MCU) and with built-in multi-time programming (MPT) capability. In one example, the highly integrated PD controller 271 is a universal series bus (USB) Type-C controller that supports Power Delivery 2.0/3.0 standard.

Figure 4A:
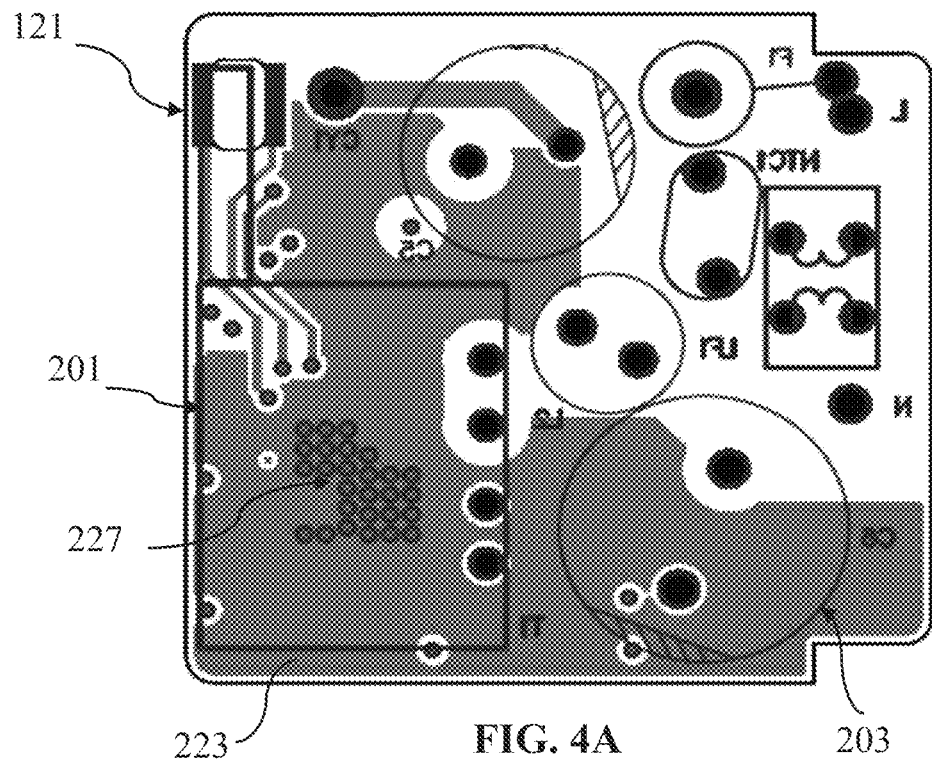
FIG. 4A, FIG. 4B and FIG. 4C are layouts of an inside layer, an outside layer and a middle layer of a first PCB of a charger in examples of the present disclosure.

In FIG. 3A, the first PCB 120 comprises an inside layer 121, an outside layer 122, and optional one or more middle layers in between. In examples of the present disclosure, the first PCB 120 includes at least part of primary side circuit 220 of FIG. 3B mounted thereon. In one example, the components of primary side circuit 220 mounted on the first PCB 120 include the transformer 201 and the bulk capacitor 203 disposed on the inside layer 121 shown in FIG. 4A, and the primary side receiver 221 disposed on the outside layer 122 shown in FIG. 4B. In another example, the components of the primary side circuit 220 mounted on the first PCB 120 further includes the bridge rectifier 202 disposed on the outside layer 122.

Figure 5A:
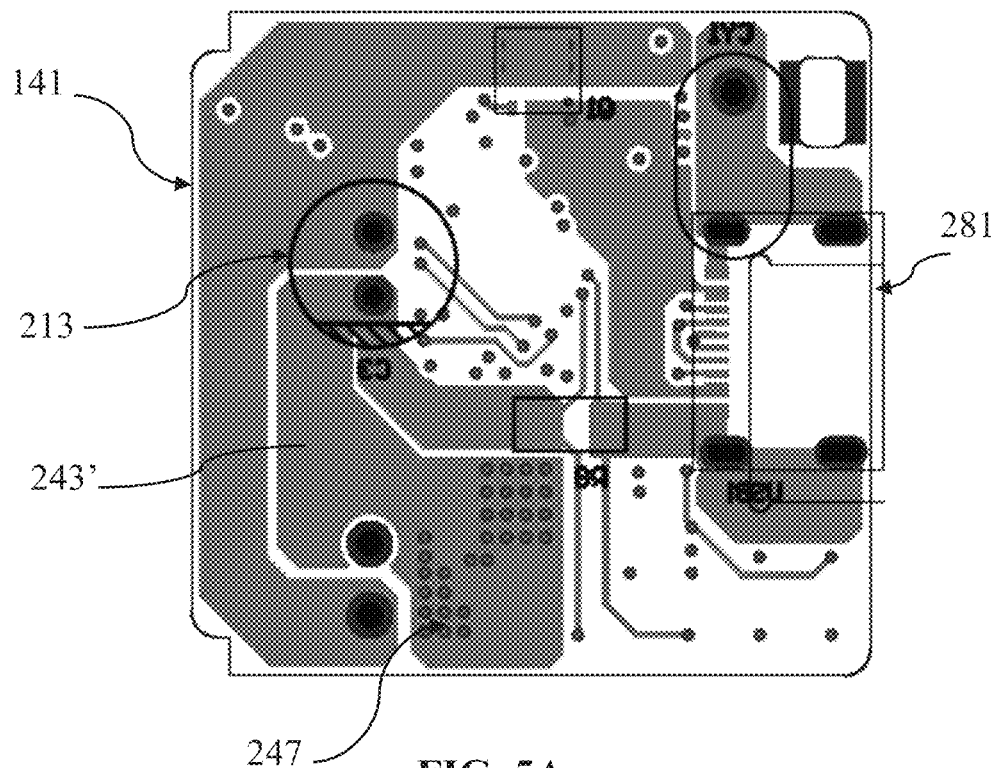
FIG. 5A, FIG. 5B and FIG. 5C are layouts of an inside layer, an outside layer and a middle layer of a second PCB of a charger in examples of the present disclosure.

In FIG. 3A, the second PCB 140 comprises an inside layer 141, an outside layer 142, and optional one or more middle layers in between. The second PCB 140 comprises at least part of secondary side circuit 240 of FIG. 2. In one example, the components of the secondary side circuit 240 mounted on the second PCB 140 includes the output capacitor 213 disposed on the inside layer 141 shown in FIG. 5A, the secondary side STR controller 241 and the highly integrated PD controller 271 disposed on the outside layer 142 shown in FIG. 5B. In another example, the components of the secondary side circuit 240 mounted on the second PCB 140 further includes the multi-pin output interconnection socket 281 disposed on the inside layer 141. As shown in FIG. 3A, the inside layer 121 of the first PCB 120 faces the inside layer 141 of the second PCB 140 such that the transformer 201, the bulk capacitor 203, the output capacitor 213 and other bulky components are confined in a space between the first PCB 120 and the second PCB 140. The low profile surface mount components, including the primary side receiver 221, the secondary side STR controller 241 and the highly integrated PD controller 271, are on the outside layers 122 and 142 facing the first and second side surfaces 111 and 112 of the housing 110 respectively. The multi-pin output interconnection socket 281 is preferably mounted on an edge of the second PCB 140 facing the opening 180 on the top surface of the housing 110.

Figure 4B:
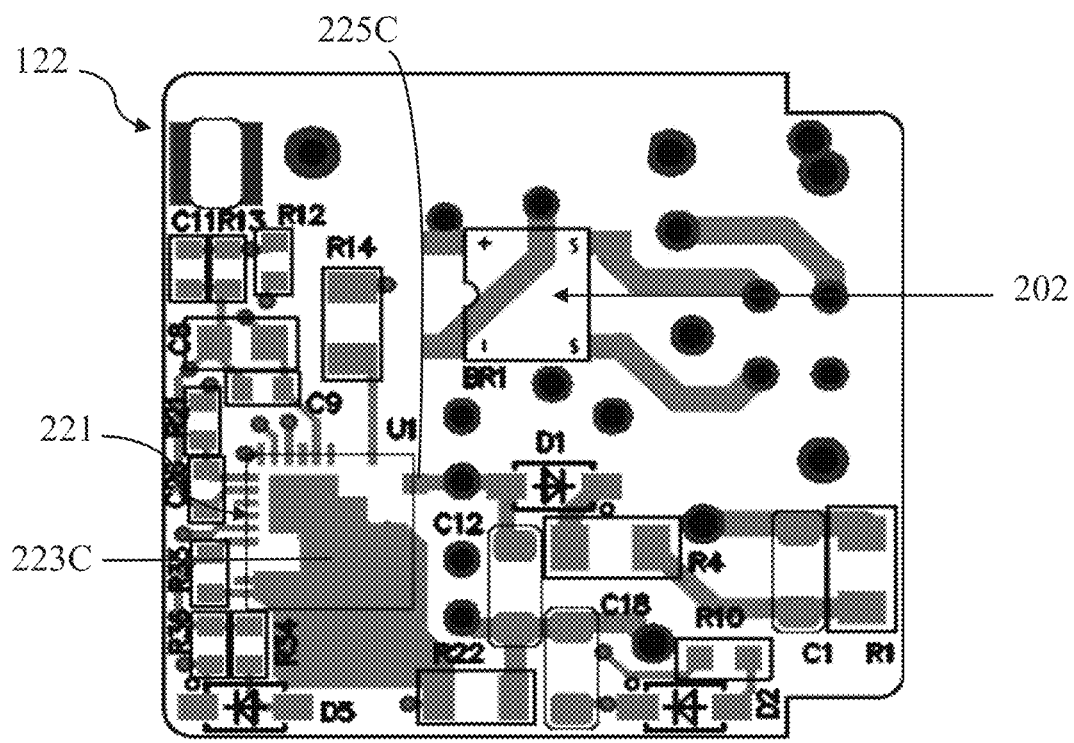

To avoid the thermal dissipation issues and EMI issues presented in the prior art apparatus, the outside layer 122 of the first PCB 120 of the present disclosure is provided with a large area source contact pad 223C and a small area drain contact pad 225C as shown in FIG. 4B. In one example, the large area of the large area source contact pad 223C is ten times or more of the small area of the small area drain contact pad 225C. In another example, the large area of the large area source contact pad 223C is twenty times or more of the small area of the small area drain contact pad 225C. The large area source contact pad 223C has a shape substantially conforming to a bottom surface 319 of a die paddle exposed from a bottom surface of a semiconductor package of the primary side receiver 221 shown in FIG. 6C to provide a large source connecting area between the source contact pad 223C and the exposed die paddle that serves a source lead of the semiconductor package. The small area drain contact pad 225C also has a shape substantially conforming to a bottom surface of a drain lead exposed from a bottom surface of the semiconductor package of the primary side receiver 221 shown in FIG. 6C to provide a small drain connecting area between the drain contact pad 225C and the exposed drain lead of the semiconductor package. In one example, a source connecting area is more than 10 times the drain connecting area. The large area source contact pad provides the benefit of fast thermal dissipation from the main switch and the small area drain contact pad provides the benefit of reducing EMI of radio frequency radiation.

Figure 4C:
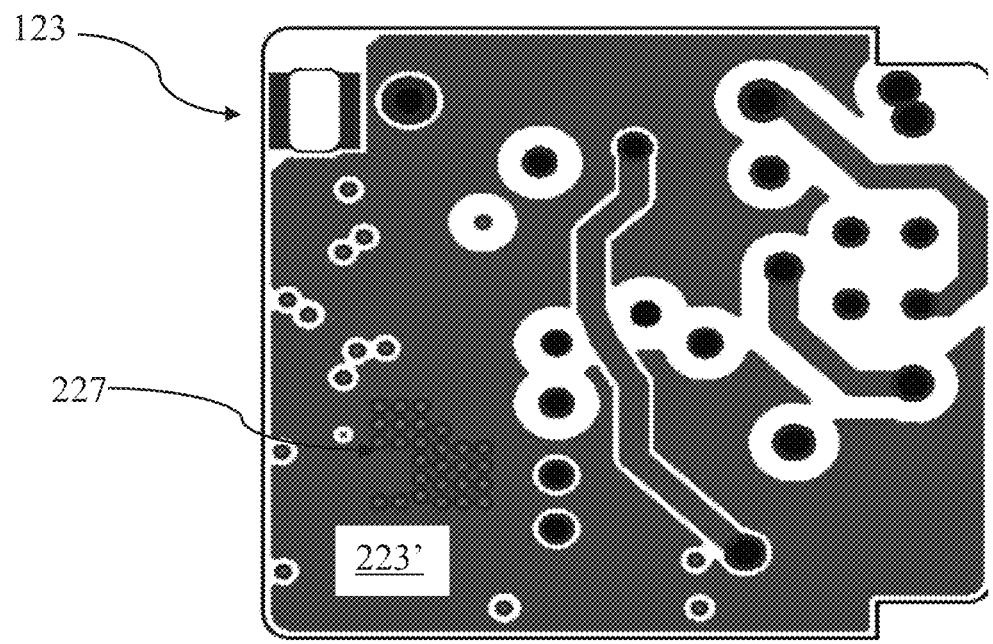
Figure 5B:
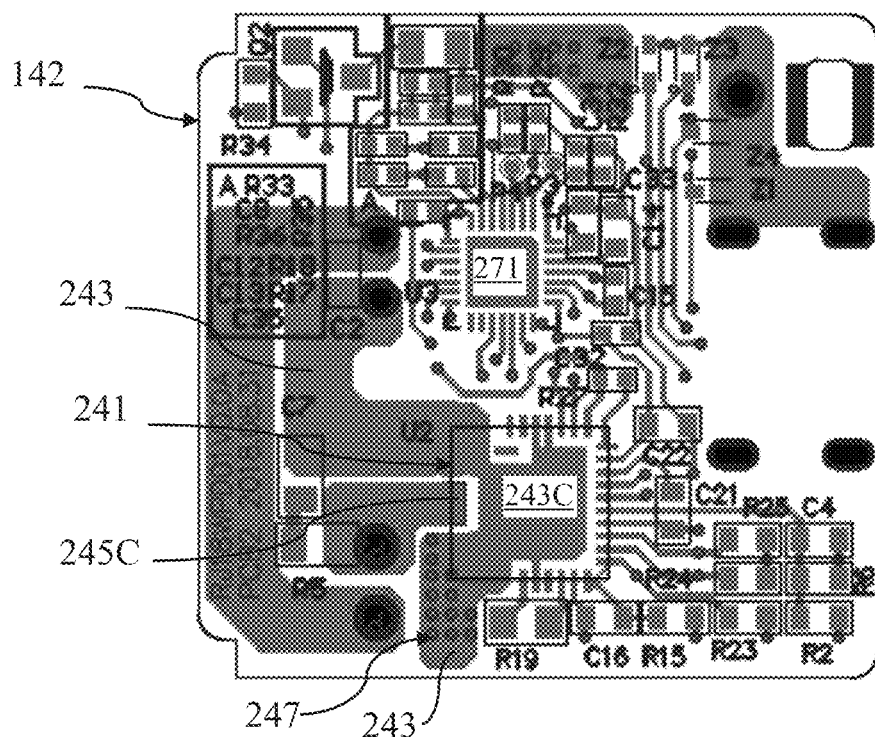
Figure 5C:
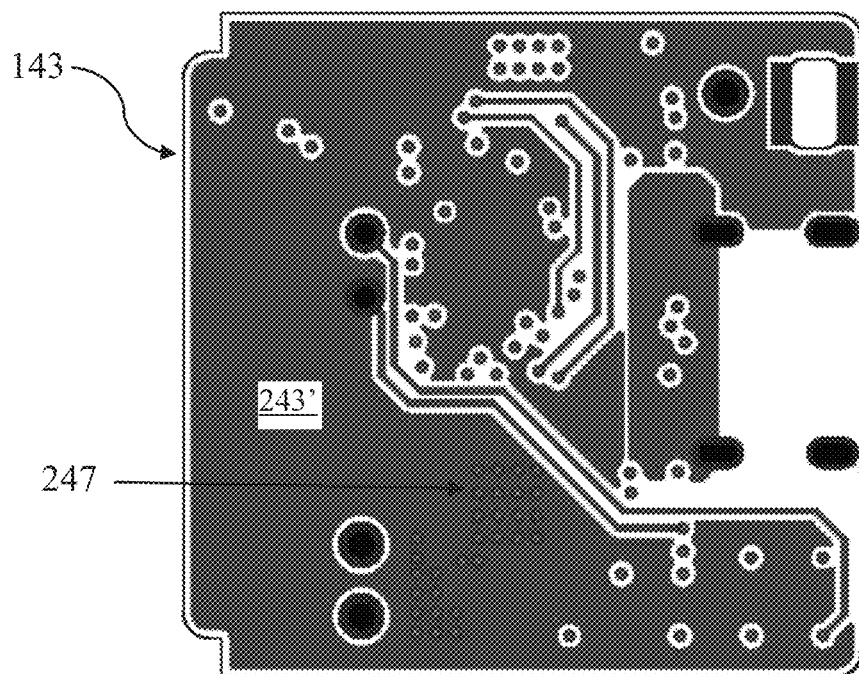

The large area source contact pad 223C expands to a large conductive area 223 on the outside layer 122 of the first PCB 120 to function as a heat sink. To further improve thermal performance on the system level, larger conductive areas 223' are provided on the inside layer 121 as well as the one or more optional middle layers 123 in FIG. 4C of the first PCB 120, connected through conductive vias 227, to the large area source contact pad 223C and the expanded conductive area 223 on the outside layer 122 of the first PCB 120. The conductive areas 223' on the one or more optional middle layers 123 may expend essentially an entire PCB area except the locations of the conductive holes and their interconnections as shown in FIG. 4C. This helps to spread and average the heat generated by the current switching element through the entire PCB thus greatly improve the thermal performance. In one example, the combine conductive areas 223' in all layers of the first PCB 120 connected through the conductive vias 227 to the source contact pad 223C is more than five times the area of the source contact pad 223C. In still another example, the combine conductive areas 223' in all layers of the first PCB 120 connected through the conductive vias 227 to the source contact pad 223C is more than ten times the area of the source contact pad 223C. For the same reason, the outside layer 142 of the second PCB 140 is provided with a large area source contact pad 243C and a small area drain contact pad 245C as shown in FIG. 5B, to provide a large source connecting area between the source contact pad 243C and a exposed die paddle of a secondary side semiconductor package shown in FIG. 7C that serves a source lead of the secondary side semiconductor package, and a small drain connecting area between the drain contact pad 245C and an exposed drain lead of the secondary side semiconductor package. In one example, a source connecting area is more than 10 times the drain connecting area. The large area source contact pad 243C expands to a large conductive area 243 on the outside layer 142 of the second PCB 140 to function as a heat sink. Larger conductive areas 243' are provided on the inside layer as well as the one or more optional middle layers 143 in FIG. 5C of the second PCB 140, connected through conductive vias 247, to the larger area source contact pad 243C and the expanded conductive area 243 on the outside layer 142 of the second PCB 140. The conductive areas 243' on the one or more optional middle layers 143 may expend essentially an entire PCB area except the locations of the conductive holes and their interconnections as shown in FIG. 5C. In one example, the combine conductive areas 243' in all layers of the second PCB 140 connected through the conductive vias 247 to the source contact pad 243C is more than five times the area of the source contact pad 243C. In still another example, the combine conductive areas 243' in all layers of the second PCB 140 connected through the conductive vias 247 to the source contact pad 243C is more than ten times the area of the source contact pad 243C.

Figures 6A, 6B, 6C:
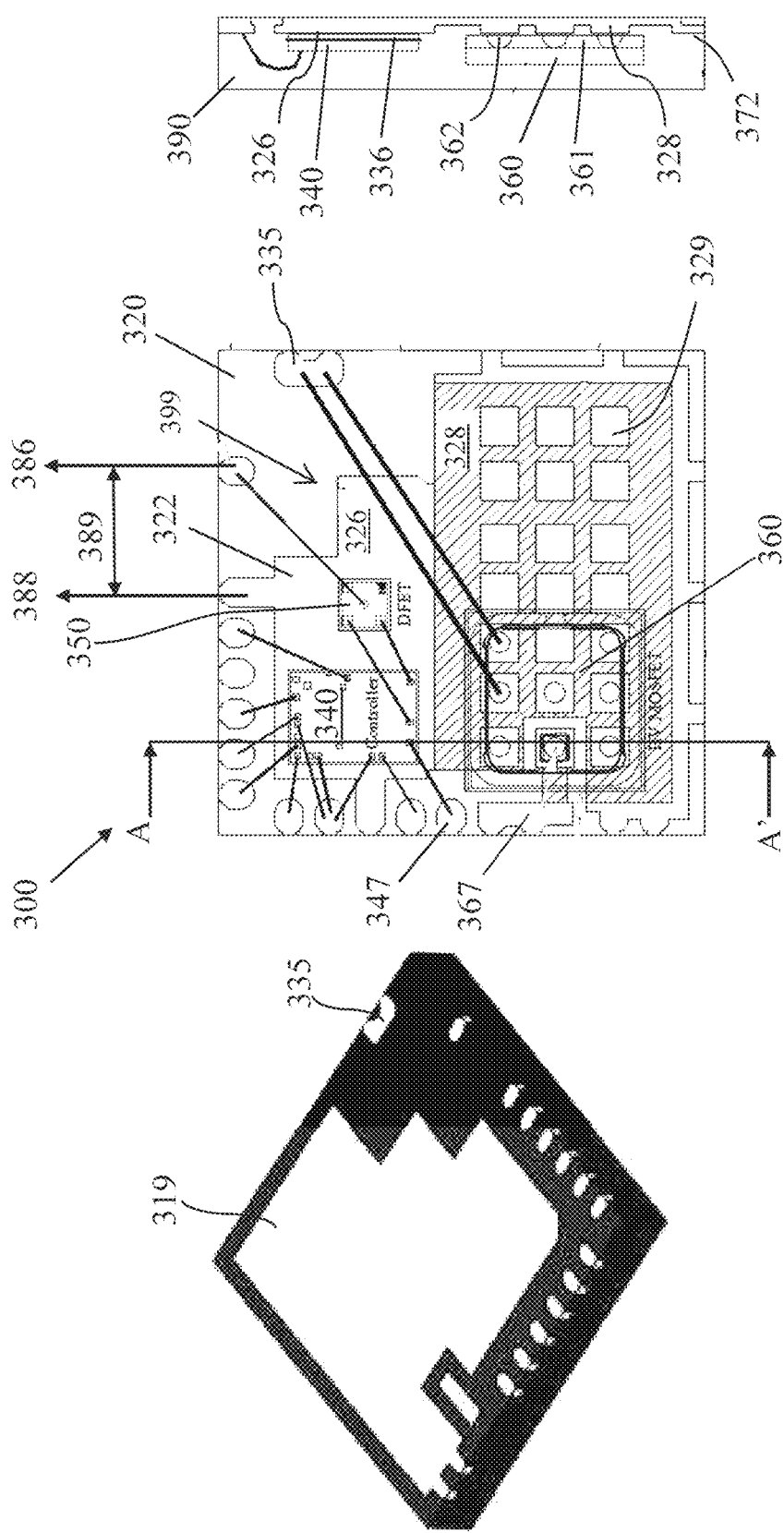
FIG. 6A is a top view and FIG. 6B is a cross sectional view.
FIG. 6C is a bottom perspective view of a high voltage (HV) semiconductor package in examples of the present disclosure

FIG. 6A is a top view, FIG. 6B is a cross sectional plot along AA', and FIG. 6C is perspective bottom view of an HV semiconductor package 300 in examples of the present disclosure. In one example, HV refers to a voltage 500 volts or more. The HV semiconductor package 300 comprises a lead frame 320, an integrated circuit (IC) 340 (which could be a receiver IC or a driver IC, or in general a controller IC), a depletion mode field effect transistor (DFET) 350 [such as a depletion mode MOSFET or a depletion mode junction field effect transistor (JFET)), an HV metal-insulator-semiconductor field-effect transistor (MOSFET) 360, and a molding encapsulation 390. The HV MOSFET 360 has a source electrode and a gate electrode disposed on a top surface and a drain electrode disposed on a bottom surface. In one example, the HV semiconductor package 300 is a primary side receiver 221, of FIG. 3B, of a charger 100 of FIG. 3A. In examples of the present disclosure, the HV semiconductor package 300 does not use copper shielding and isolation mylar on package or on board level.

The lead frame 320 comprises a die paddle 322 and a gate contact island separated from the die paddle. In one example, the lead frame 320 only comprises a single die paddle 322. The lead frame 320 does not comprise another die paddle. The die paddle 322 comprises a non-etched top surface portion 326 and an etched top surface portion 328. The IC 340 is attached to the non-etched top surface portion 326 of the die paddle 322 through a first non-conductive material 336. The DFET 350 is attached to the non-etched top surface portion 326 of the die paddle 322 through a second non-conductive material 356. The HV MOSFET 360 is attached to the etched top surface portion 328 of the die paddle 322 through a conductive material (for example, a plurality of solder balls 362). A majority portion of the HV MOSFET 360 front surface is enclosed by a pre-molded encapsulation 372.

The molding encapsulation 390 encloses the IC 340, the DFET 350, the HV MOSFET 360, and a majority portion of the lead frame 320. The IC 340 and the DFET 350 are in face-up placements. The HV MOSFET 360 is in a flipped chip placement. A source electrode 361 of the HV MOSFET 360 is directly connected to the plurality of solder balls 362. The plurality of solder balls 362 are directly attached to the etched top surface portion 328 of the die paddle 322.

The etched top surface portion 328 of the die paddle 322 comprises an array 329 of recesses. A depth of each of the array 329 of recesses is from 45% to 55% of a thickness of the die paddle 322.

In examples of the present disclosure, a horizontal distance 389 between an HV lead 386 and an adjacent low voltage lead 388 connected to the die paddle 322 must not be less than a horizontal creepage distance corresponding to the voltage rating of HV semiconductor package 300. As shown in FIG. 6A, the HV lead 386 and the drain lead 335 are disposed at two sides adjacent a corner where the die paddle 322 has cut off to maintain the horizontal creepage distance. It is desirable to minimize the cut off area to maintain the maximum available die paddle bottom surface area. In examples of the present disclosure, the die paddle has an inverse L shape cutoff 399 to maintain a horizontal creepage distance of at least 1.1 mm from the HV lead 386 and the drain lead 335. The HV MOSFET 360 comprises a plurality of solder balls 362. A majority portion of the plurality of solder balls 362 are enclosed by the pre-molded encapsulation 372. A vertical creepage distance is maintained by a height of the plurality of solder balls 362 that separates the HV MOSFET 360 from the etched top surface portion 328 of the die paddle 322.

In another example, the bottom exposed source is more than 10 times a bottom exposed area of the drain lead 335 of FIG. 6C. In still another example, the bottom exposed source is more than 20 times the bottom exposed area of the drain lead 335 of FIG. 6C. In examples of the present disclosure, a bottom surface 319 of FIG. 6C of the die paddle 322 is exposed from the molding encapsulation 390. In one example, a surface area of the exposed bottom surface 319 of the die paddle 322 is at least 60% of a bottom surface of the HV semiconductor package 300. In still another example, a surface area of the exposed bottom surface 319 of the die paddle 322 is at least 80% of a bottom surface of the HV semiconductor package 300. Because the IC 340, the DFET 350 and the HV MOSFET 360 are mounted on the same die paddle 322 for the purpose of reducing component counts and because the HV MOSFET 360 is in a flipped chip placement, the HV semiconductor package 300 can have a large power ground (electrically connected to the source electrode 361 of the HV MOSFET 360, the exposed bottom surface 319 of the die paddle 322, and the low voltage lead 388). The exposed bottom surface 319 of the die paddle 322 is connected to the large source contact pad 223C of the first PCB 120 to facilitate heat dissipation in order to satisfy maximum skin temperature requirement (a user's hand touches a housing 110 of the charger 100) of 77 degrees C. Alternatively, the HV semiconductor package 300 may only include the HV MOSFET 360 mounted on the die paddle 322 in a flipped chip placement, and the IC 340, the DFET 350 are provided in one or more separate semiconductor packages, or the HV semiconductor package 300 may include the HV MOSFET 360 mounted on the die paddle 322 in a flipped chip placement, co-packaged with one of the IC 340 and the DFET 350.

In examples of the present disclosure, the HV MOSFET 360 is isolated from the IC 340 and is isolated from the DFET 350 within the HV semiconductor package 300. The lead 347 (a controller gate drive output) and the lead 367 (a MOSFET gate) are not electrically connected within the HV semiconductor package 300. The HV MOSFET 360 may be electrically connected to the IC 340 through a circuit external to the HV semiconductor package 300. Therefore, the present disclosure provides flexibility for other additional control from external circuit. Alternately, the controller gate drive output may internally connect to the MOSFET gate such that gate terminal is provided on the HV semiconductor package 300.

FIG. 7A is a top view and FIG. 7B is a cross sectional plot along CC' of a semiconductor package 400 in examples of the present disclosure. The semiconductor package 400 comprises a lead frame 420, a controller 440, a MOSFET 460, and a molding encapsulation 490. In one example, the semiconductor package 400 is a secondary side STR controller 241, of FIG. 3B, of a charger 100 of FIG. 3A.

The lead frame 420 comprises a die paddle 422. In one example, the lead frame 420 only comprises a single die paddle 422. The lead frame 420 does not comprise another die paddle. The die paddle 422 comprises a non-etched top surface portion 426 and an etched top surface portion 428. The controller 440 is attached to the non-etched top surface portion 426 of the die paddle 422 through a non-conductive material 436. The MOSFET 460 is attached to the etched top surface portion 428 of the die paddle 422 through a conductive material 462.

The molding encapsulation 490 encloses the controller 440, the MOSFET 460, and a majority portion of the lead frame 420. The controller 440 is in a face-up placement. The MOSFET 460 is in a flipped chip placement. A source electrode 461 of the MOSFET 460 is directly connected to the conductive material 462. The conductive material 462 is directly attached to the etched top surface portion 428 of the die paddle 422.

The etched top surface portion 428 of the die paddle 422 comprises an array 429 of recesses. A depth of each of the array 429 of recesses is from 45% to 55% of a thickness of the die paddle 422.

Figure 8:
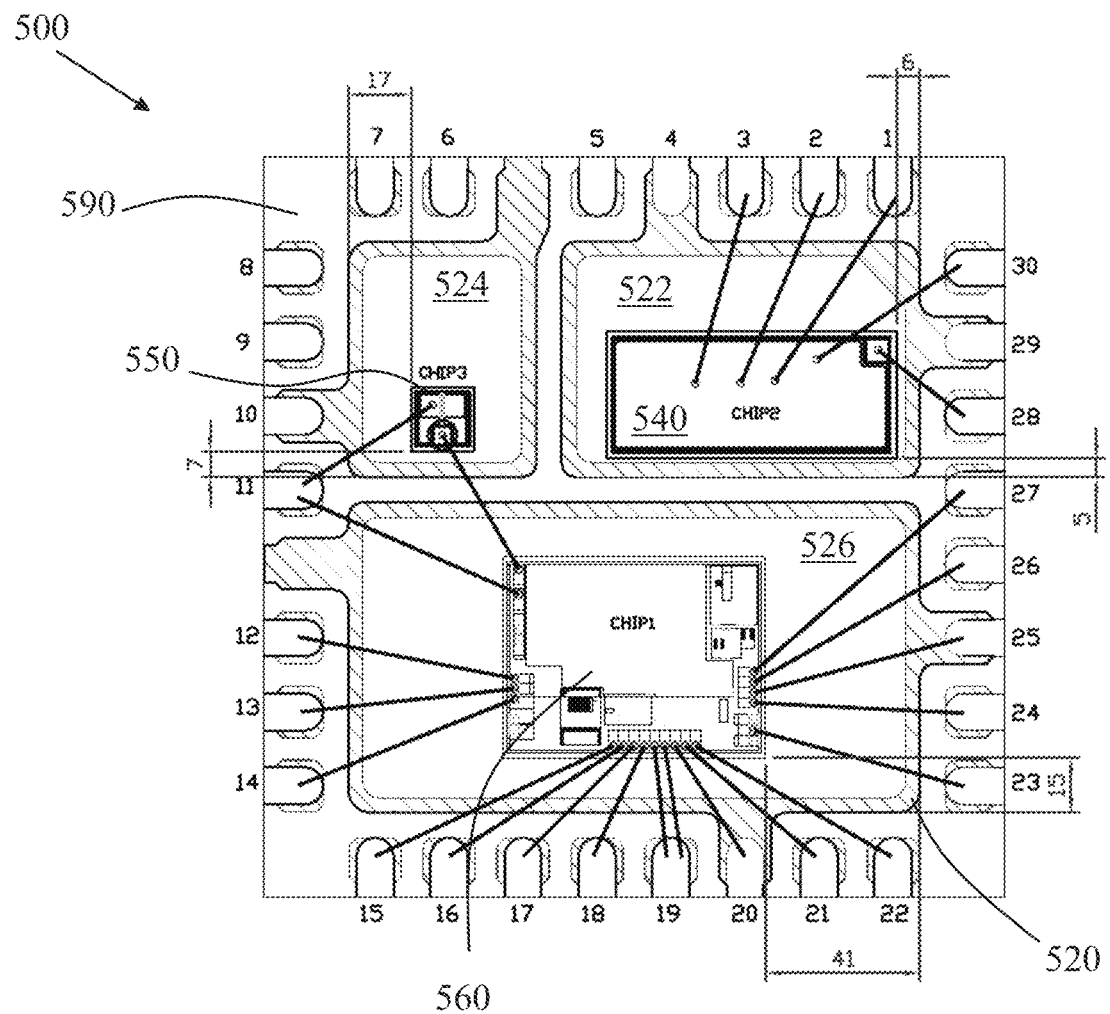
FIG. 8 is a top view of another semiconductor package in examples of the present disclosure.

FIG. 8 is a top view of a semiconductor package 500 in examples of the present disclosure. The semiconductor package 500 comprises a lead frame 520, a PD controller 540, a first MOSFET 550, a second MOSFET 560, and a molding encapsulation 590 (shown in transparent). In one example, the semiconductor package 500 is a secondary side highly integrated PD controller 271, of FIG. 3B, of a charger 100 of FIG. 3A.

The lead frame 520 comprises a first die paddle 522, a second die paddle 524, and a third die paddle 526. The PD controller 540 is attached to the first die paddle 522. The first MOSFET 550 is attached to the second die paddle 524. The second MOSFET 560 is attached to the third die paddle 526. The first die paddle 522, the second die paddle 524 and the third die paddle 526 are separated from each other.

Figure 9A:
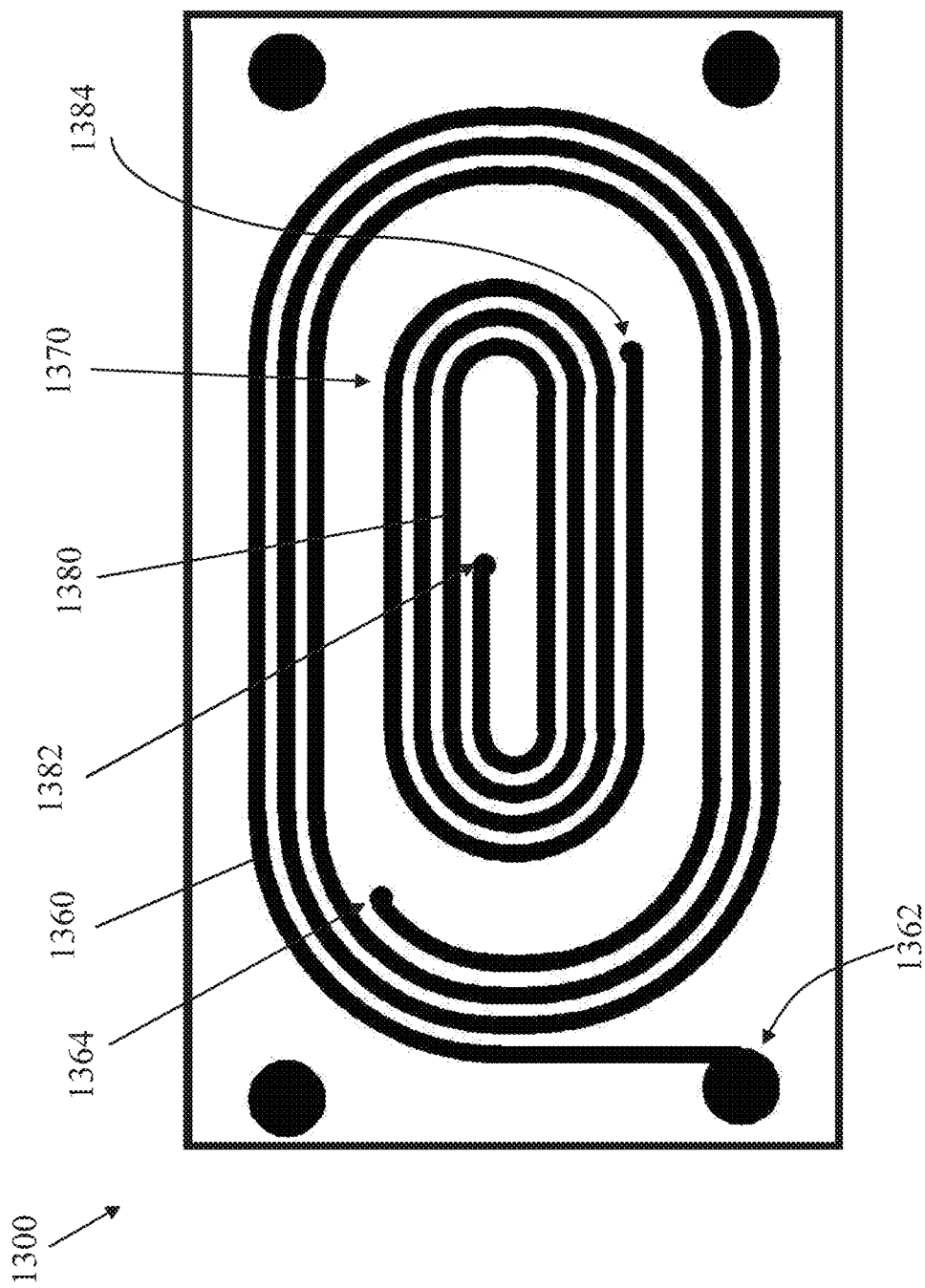
FIGS. 9A, 9B and 9C show top view of an upper layer, a lower layer, and a bottom layer of a PCB in examples of the present disclosure.
Figure 9B:
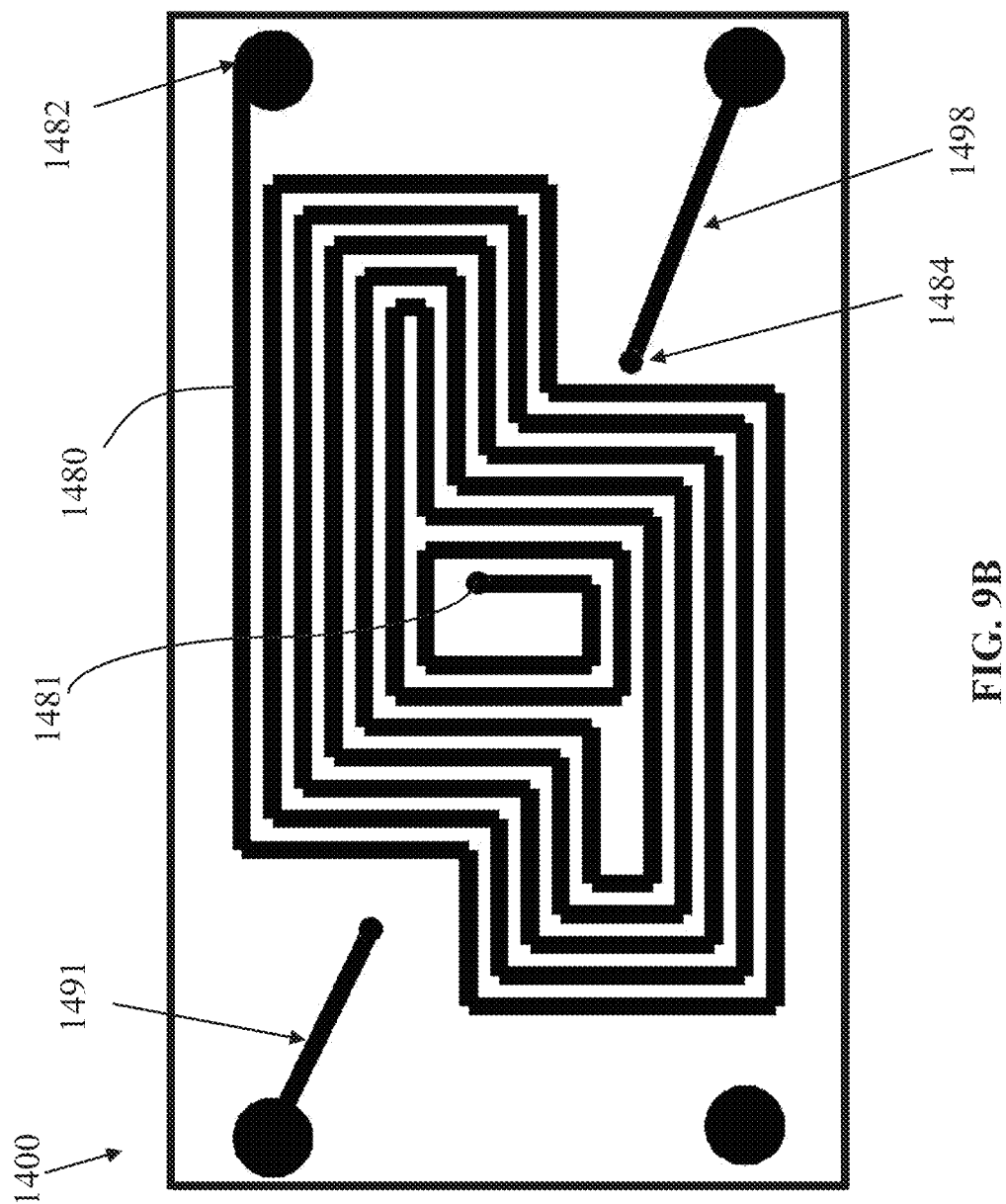
Figure 9C:
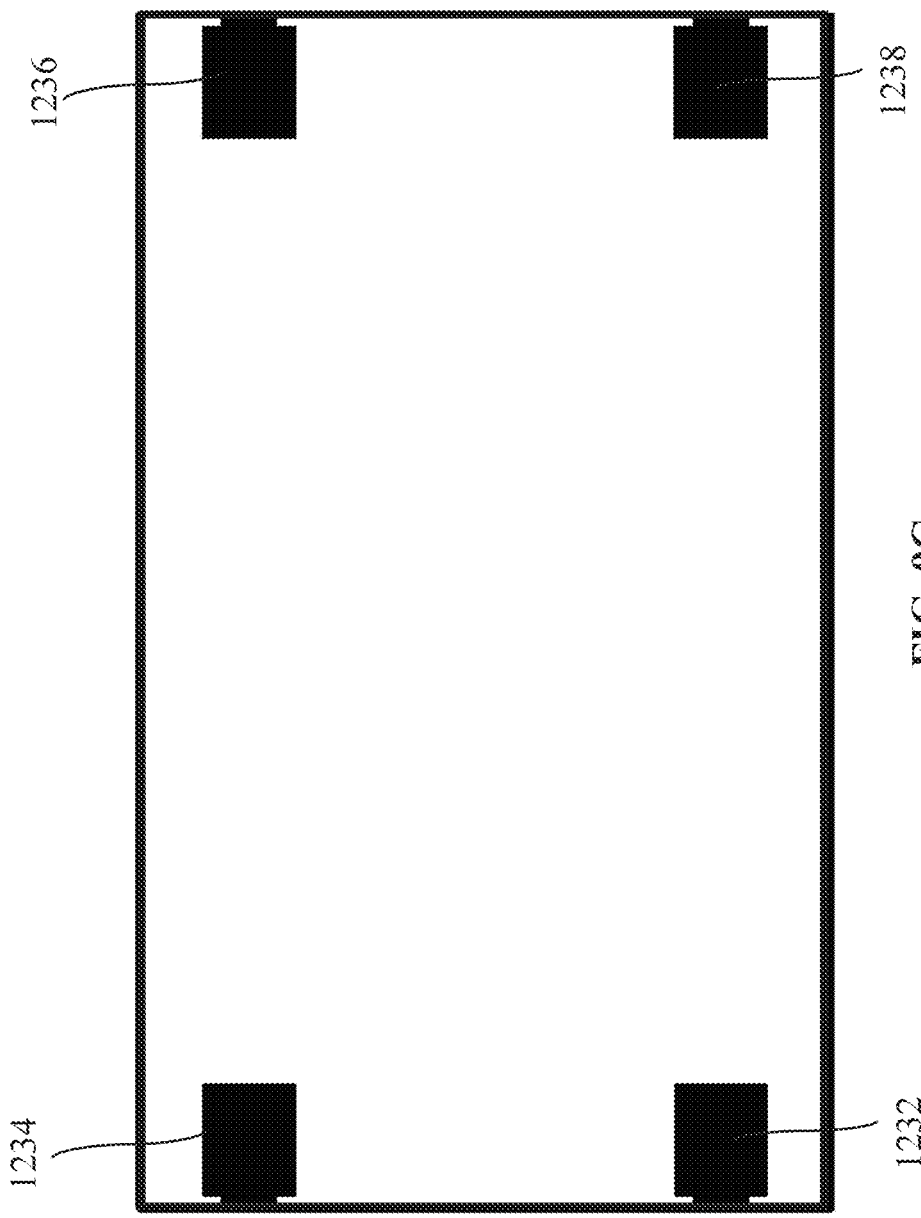

In one example, the isolation coupling element 250 used in the charger 100 of FIG. 3A is a coreless pulse transformer. As shown in FIGS. 9A and 9B, the isolation coupling element 250 is formed of conductive traces on a multiple layer PCB. In examples of the present disclosure, an upper layer 1300 comprises a primary coil 1360 including a number of turns and a first portion 1380 of a secondary coil 1370. The primary coil 1360 is disposed at an outer portion of the upper layer 1300 enclosing the first portion 1380 of the secondary coil 1370 disposed at an inner portion of the upper layer 1300. A lower layer 1400 comprises a second portion 1480 of the secondary coil 1370. The first portion 1380 of the secondary coil 1370 on the upper layer 1300 has a first end 1382 located in a central portion of the upper layer 1300 connected to a first end 1481 of the second portion 1480 located in a central portion of the lower layer 1400. A second end 1384 of the first portion 1380 of the secondary coil 1370 on the upper layer 1300 is connected to a second end 1484 of the secondary coil 1370 on the lower layer 1400. In examples of the present disclosure, an optional top layer (not shown) may be provided overlaying the upper layer 1300 and an optional bottom layer 1200 may be provided to cover the lower layer 1400 to protect the coil trances of the isolation coupling element 250. A first pad 1232 on the bottom layer 1200 may be connected to a first end 1362 of the primary coil 1360 through a first set of one or more vias. A second pad 1234 on the bottom layer 1200 may be connected to a second end 1364 of the primary coil 1360 through a second set of one or more vias and conductive trace 1494 on the lower layer 1400. A third pad 1236 on the bottom layer 1200 may be connected to a first end 1482 of the secondary coil 1370 on the lower layer 1400 through a third set of one or more vias. A fourth pad 1238 on the bottom layer 1200 may be connected to a second end 1484 of the secondary coil 1370 through a fourth set of one or more vias and conductive trace 1498 on the lower layer 1400. Alternatively, the contact pads may form on the optional bottom layer.

In one example, the isolation coupling element 250 has a turns ration of 3:10 between the primary coil and the secondary coil. In another example, the isolation coupling element 250 provides 50 nH of mutual inductance at 100 kHz. In still another example, the isolation coupling element 250 provides a galvanic isolation up to 5.5 kVrms. In one example, the isolation coupling element 250 is formed on a four-layer PCB. In another example, the isolation coupling element 250 is formed as a standalone component having a size of 9.5 mm×5.5 mm×1.8 mm or less. The isolation coupling element 250 may be disposed on the first PCB 120 or on the second PCB 140.

In examples of the present disclosure, the charger 100 of FIG. 3A further comprises an optional third PCB 160 disposed in the space between the first PCB 120 and the second PCB 140. The third PCB 160 is perpendicular to the first PCB 120 and the second PCB 140. In one example, the multi-pin output interconnection socket 281 is mounted on an edge of the third PCB 160 facing the opening 180 on the top surface of the housing 110. In another example, the third PCB 160 includes the isolation coupling element 250 disposed thereon. In examples of the present disclosure, the isolation coupling element 250 is a standalone element mounted on the third PCB or embedded in the third PCB.

In examples of the present disclosure, the charger 100 has a power density of more than 0.5 W/cc. In one example, a 18 W PD charger is provided in a compact size of 30 mm×33 mm×29 mm. In another example, a 30 W PD charger is provided in a compact size of 39 mm×35 mm×39 mm. In yet another example, a 45 W PD charger is provided in a compact size of 48 mm×48 mm×28 mm. The power density delivered by a PD charger of the present disclosure is much higher than the maximum power density of PD chargers for mobile devices currently available on the market.

Those of ordinary skill in the art may recognize that modifications of the embodiments disclosed herein are possible. For example, a number of rows and a number of columns of the array 329 of recesses may vary. For example, a size of each of the array 329 of recesses may vary. Other modifications may occur to those of ordinary skill in this art, and all such modifications are deemed to fall within the purview of the present invention, as defined by the claims.

The invention claimed is:

1. An AC/DC converter implemented on a multi-layer printed circuit board (PCB), the AC/DC converter comprising:
   a transformer comprising a primary coil and a secondary coil, a first terminal of the primary coil receiving a bulk voltage;
   a power semiconductor package comprising a main switch having a source electrode connected to a source lead and a drain electrode connected to a drain lead;
   wherein the drain lead is connected to a drain contact pad on the PCB;
   wherein the drain contact pad is electrically connected to a second terminal of the primary coil of the transformer;
   wherein the source lead is connected to a source contact pad on the PCB; and
   wherein an area of the source lead connecting the source contact pad on the PCB is larger than an area of the drain lead connecting the drain contact pad on the PCB.

2. The AC/DC converter of claim 1,
   wherein the PCB comprises one or more middle layers between a top layer and a bottom layer.

3. The AC/DC converter of claim 2, wherein
   a middle layer of the PCB comprises a conductive area connected to the source contact pad.

4. The AC/DC converter of claim 2, wherein the power semiconductor package is disposed on the top layer and the transformer is disposed on the bottom layer.

5. The AC/DC converter of claim 1, wherein the power semiconductor package further comprises a driver IC to provide a driving signal to control the main switch.

6. The AC/DC converter of claim 5, wherein the power semiconductor package further comprises a depletion mode field effect transistor (DFET) to receive the bulk voltage to generate a starting signal to control the main switch.

7. The AC/DC converter of claim 1 further comprising a driver IC to provide a driving signal to control the main switch.

8. The AC/DC converter of claim 7 further comprising:
   a secondary side controller, wherein the secondary side controller comprises:

a feedback loop with a comparator receiving a feedback voltage proportional to an output voltage on an inverse terminal comparing to a reference voltage on a non-inverse terminal.

9. The AC/DC converter of claim 8, wherein the secondary side controller further comprises an on-time generator receiving a comparing result from the comparator to generate an on-time control signal.

10. The AC/DC converter of claim 8 further comprising a synchronous MOSFET transistor having a drain electrode connected to a second terminal of the secondary coil and a source electrode connected to ground.

11. The AC/DC converter of claim 8 further comprising an isolation coupling element connected between the secondary side controller and the driver.

12. The AC/DC converter of claim 11, wherein the driver generates the driving signal to turn on and off a main MOSFET transistor to regulate a current flow through the primary coil of the transformer at a switching frequency higher than a maximum 85 kHz at a full load.

13. The AC/DC converter of claim 12, wherein a natural peak load operation frequency is clamped at maximum 150 kHz.

14. The AC/DC converter of claim 13, wherein an output voltage comprises a ripple noise including a low frequency AC ripple and a high frequency switching ripple at the switching frequency; and wherein switching ripple frequencies around peaks of the bulk voltage are lower than switching ripple frequencies around valleys of the bulk voltage.

15. The AC/DC converter of claim 14, wherein the output voltage is free of sub-harmonic frequency ripple noise.

16. The AC/DC converter of claim 13, wherein the secondary side controller is a constant on-time controller; and wherein in a full load condition, when bulk voltage decreases, the controller increases on-time to keep loading till a maximum on-time is reached.

17. The AC/DC converter of claim 16, wherein the maximum on-time is 80% of a duty cycle.

18. The AC/DC converter of claim 16, wherein when the maximum on-time is reached, the controller increases the switching frequency when a bulk capacitor voltage continues to decrease.

19. The AC/DC converter of claim 1 further comprising a power delivery (PD) controller with a built-in microcontroller unit (MCU) to communicate with a load.

20. The AC/DC converter of claim 19, wherein the PD controller is a USB Type-C controller.

* * * * *